United States Patent [19]
Park et al.

[11] Patent Number: 5,708,608
[45] Date of Patent: Jan. 13, 1998

[54] HIGH-SPEED AND LOW-NOISE OUTPUT BUFFER

[75] Inventors: Geun Young Park; Kwang Sup Shin, both of Kyoungkido, Rep. of Korea

[73] Assignee: Hyundai Electronics Industries CP., Ltd., Kyoungkido, Rep. of Korea

[21] Appl. No.: 773,563

[22] Filed: Dec. 27, 1996

[30] Foreign Application Priority Data

Dec. 28, 1995 [KR] Rep. of Korea ............... 1995-62119

[51] Int. Cl.$^6$ ........................... G11C 7/00
[52] U.S. Cl. .................. 365/189.05; 365/189.11; 326/33
[58] Field of Search ............. 365/189.05, 189.11, 365/194; 326/27, 33

[56] References Cited

U.S. PATENT DOCUMENTS

| | | | |
|---|---|---|---|
| 5,067,109 | 11/1991 | Kim et al. | 365/189.05 |
| 5,214,609 | 5/1993 | Kato et al. | 365/189.05 |
| 5,384,736 | 1/1995 | Jung et al. | 365/189.05 |
| 5,398,318 | 3/1995 | Hiraishi et al. | 326/83 |
| 5,535,171 | 7/1996 | Kim et al. | 365/189.05 |
| 5,602,783 | 2/1997 | Ong | 365/189.05 |

*Primary Examiner*—Son T. Dinh
*Attorney, Agent, or Firm*—Jacobson, Price, Holman & Stern, PLLC

[57] ABSTRACT

The disclosure is an output buffer capable of preventing a noise by reducing a gradient value of input voltage of an input terminal using a detector which selectively operates only under high supply voltage to reduce a peak value of the current through the pull-up and pull-down transistors of the output buffer, and also capable of achieving an output depending upon the speed by using the conventional circuit under supply voltage less than rated voltage.

9 Claims, 4 Drawing Sheets

HIGH-SPEED AND LOW-NOISE OUTPUT BUFFER

BACKGROUND OF THE INVENTION

1. Field of the Invention

The present invention relates to an output buffer of a semiconductor memory device such as a static random access memory SRAM and a dynamic random access memory DRAM, etc., and more particularly to a high-speed and low-noise output buffer.

2. Discussion of Related Art

In FIG. 1 showing a conventional output buffer, there are provided a pull-up transistor 11 pulling up an output terminal OUT and a pull-down transistor 12 pulling down the output terminal OUT, according to an input value input from a sense amplifier SA. Further, a box 13 represents a sub circuit part of the output buffer used for reducing a noise due to the pull-up and pull-down transistors being made in a large size.

In the conventional output buffer as mentioned above, much noise is generated due to a large amount of current flowing upon output of data in a situation when a high supply voltage is applied. But, in this output buffer, if a rated supply voltage or low supply voltage less than 5V is applied, there occurs a little noise. Therefore, a speed is emphasized in designing the output buffer.

Accordingly, in case of designing the output buffer putting emphasis upon the speed under a low supply voltage, there is a problem that much noise may be generated under a high supply voltage, and on the other hand, in case of designing the output buffer capable of suppressing the noise under the high supply voltage, there occurs a problem that the speed is reduced.

SUMMARY OF THE INVENTION

Accordingly, the present invention is directed to a high-speed and low-noise output buffer that substantially obviates one or more of the problems due to limitations and disadvantages of the related art.

An object of the present invention is to provide an output buffer capable of simultaneously overcoming problems that much noise is generated under a high supply voltage and a speed is seduced under a low supply voltage.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an output buffer of a semiconductor memory device having a pull-up transistor inputting an output value from a sense amplifier at its gate terminals to pull up an output terminal and a pull-down transistor pulling down the output terminal, includes: a charging unit for reducing a voltage gradient of a pull-up transistor by temporarily charging voltage of the gate terminal of the pull-up transistor when an unstable high voltage is applied from an external supply voltage unit and the output value of the sense amplifier is changed from a logic "high" level to a logic "low" level; a discharging unit for reducing a voltage gradient of a gate terminal of a pull-down transistor by temporarily discharging voltage of the gate terminal of the pull-down transistor when an unstable high voltage is applied from an external supply voltage unit and the output value of the sense amplifier is changed from a logic "low" level to a logic "high" level; a first voltage generating unit connected to the first reducing means to output a given voltage by which the first reducing means is off to the first reducing means when a stable low voltage is applied from the external supply voltage unit; and a second voltage generating unit connected to the second reducing means to output a given voltage by which the second reducing means is off to the second reducing means when a stable low voltage is applied from the external supply voltage unit.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

DETAILED DESCRIPTION OF PREFERRED EMBODIMENT

Reference will now be made in detail to the preferred embodiments of the present invention, examples of which are illustrated in the accompanying drawings.

In the present invention, a peak value of the current through the pull-up and pull-down transistors of the output buffer is reduced by reducing a gradient value of input voltage of an input terminal using a detector which selectively operates only under high supply voltage, so that a noise can be prevented. Further, when supply voltage less than rated voltage is applied, the conventional circuit operates, and thereby the output can be made depending upon the speed.

Figure 1:
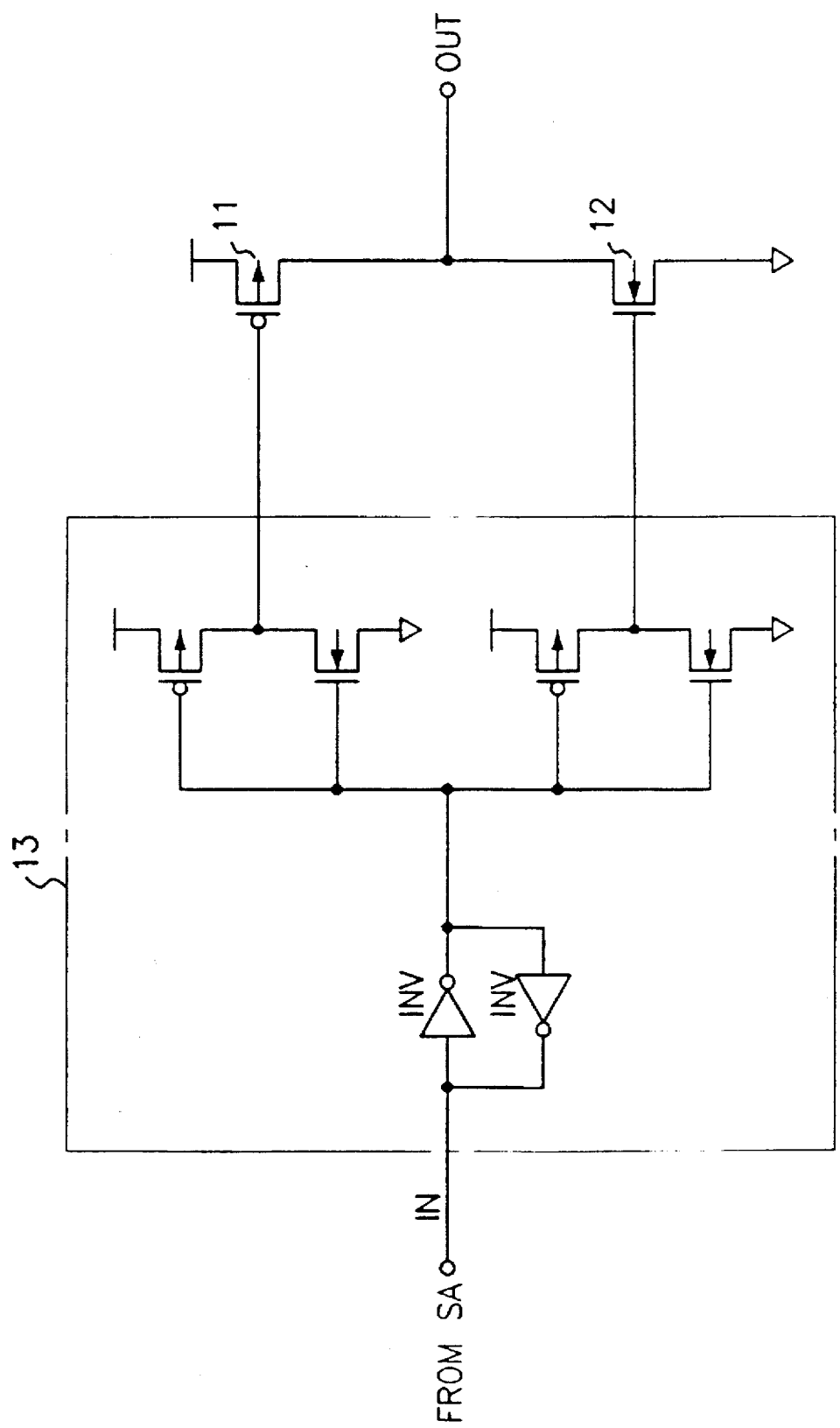
FIG. 1 is a circuit diagram illustrating a conventional output buffer.
Figure 2:
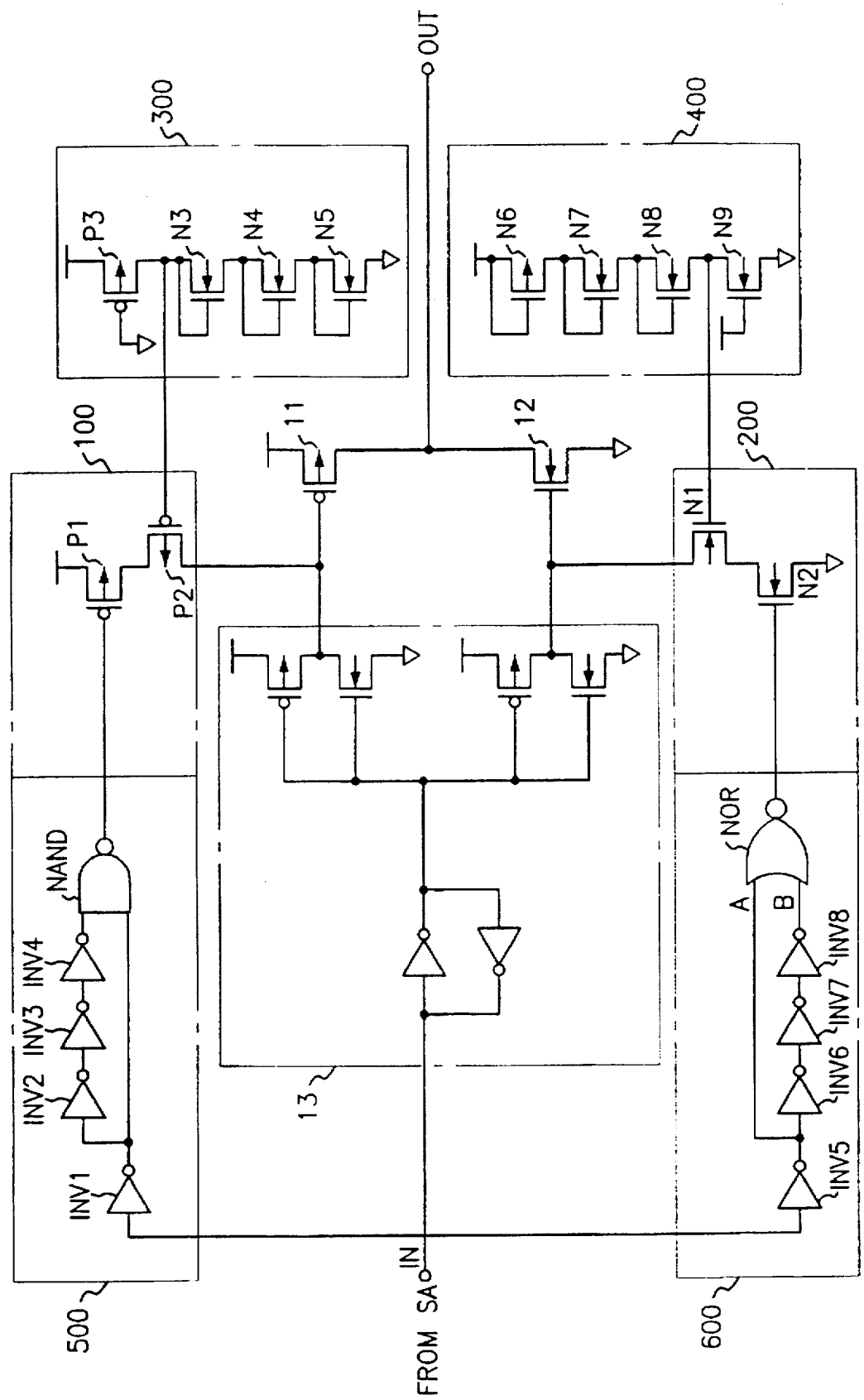
FIG. 2 is a circuit diagram illustrating an output buffer in accordance with one embodiment of the present invention.

In FIG. 2 showing an output buffer in accordance with an embodiment of the present invention, a pull-up transistor of an output terminal of the output buffer and a pull-down transistor thereof are respectively denoted as 11 and 12, and a sub circuit unit of the output buffer used for reducing the noise is denoted as 13. Further, labels 100, 200, 300, 400, 500 and 600 represent a charging unit of a gate terminal of the pull-up transistor, a discharging unit of a gate terminal of the pull-down transistor, a first voltage generating unit, a second voltage generating unit, a high/low detecting unit and a low/high detecting unit, respectively.

The charging unit 100 is comprised of PMOS transistors P1 and P2 connected between the supply voltage and the gate terminal of the pull-up transistor 11, and temporarily charges the voltage of the gate terminal of the pull-up transistor 11 to reduce an gradient of the gate voltage of the pull-up transistor when an unstable high voltage is applied from the supply voltage unit and an output value of a sense amplifier is changed from a logic "high" level to a logic "low" level.

The discharging unit 200 is comprised of NMOS transistors N1 and N2 connected between gate terminal of the pull-down transistor 12 and ground voltage unit, and temporarily discharges the voltage of the gate terminal of the pull-down transistor 12 to reduce an gradient of the gate voltage of the pull-up transistor when the unstable high voltage from the supply voltage unit and the output value of a sense amplifier is changed from a logic "low" level to a logic "high" level.

The first voltage generating unit 300 a channel of which is formed between a supply voltage unit and the PMOS transistor P2 of the charging unit 100 is comprised of a PMOS transistor P3 provided with a ground voltage through its gate and NMOS transistors N3, N4 and N5 of a plural diode type which are in series connected between the gate of the PMOS transistor P2 of the charging unit 100 and the ground voltage unit. And also, the first voltage generating unit 300 outputs a constant voltage of 3Vt (threshold voltage of N3, N4 and N5) to the charging unit 100 so that the charging unit 100 can be off when a stable low voltage is applied from the supply voltage unit.

The second voltage generating unit 400 a channel of which is formed between the ground voltage unit and the gate of the NMOS transistor N2 of the discharging unit 200 is comprised of art NMOS transistor N9 provided with the supply voltage through its gate and NMOS transistors N6, N7 and N8 of a plural diode type which are in series connected between the supply voltage unit and the gate of the NMOS transistor N2 of the discharging unit 200. And, the second voltage generating unit 400 outputs a given reference voltage (supply voltage −3Vt) so that the discharging unit 200 can be off when a stable low voltage is applied from the supply voltage unit.

The high/low detecting unit 500 comprises a logic circuit generating a logic "low" pulse to the gate terminal of the PMOS transistor P1 of the charging unit 100 when the output value of the sense amplifier SA is changed from the logic "high" level to the logic "low" level, and is provided with an NAND gate NAND1 which inputs an inverted signal of the sense amplifier SA at its one input terminal and a delayed signal of the sense amplifier SA at its other input terminal, as shown in FIG. 2.

The low/high detecting unit 600 comprises a logic circuit generating a logic "high" pulse to the gate terminal of the NMOS transistor N1 of the discharging unit 200 when the output value of the sense amplifier SA is changed from the logic "low" level to the logic "high" level, and is provided with an NOR gate NOR which inputs an inverted signal of the sense amplifier SA at its one input terminal and a delayed signal of the sense amplifier SA at its other input terminal, as shown in FIG. 2.

The following is an explanation of operation of the circuit having a configuration shown in FIG. 2.

Data through the sense amplifier SA in the memory cell is input to the output buffer.

First, regarding an operation of circuit in case that the output of the sense amplifier SA is changed from the logic "high" level to the logic "low" level, if an input of the logic "high" level is supplied, the gate terminals of the pull-up transistor 11 and the pull-down transistor 12 become the logic "high" state. Accordingly, the pull-down transistor operates and thereby, the output terminal OUT of the output buffer outputs the output of the logic "low" state.

At this time, if the output of the sense amplifier SA goes to the logic "low" state by next output data, the logic "low" pulse as the delayed time through inverters INV2, INV2 and INV4 is output by the high/low detecting unit 500 to be input to the gate of the P1 of the charging unit 100. Then, the first voltage generating unit 300 maintains a potential of 3Vt.

The P2 which inputs voltage of 3Vt through its gate is in a turned-off state under the low supply voltage. Accordingly, even when the logic "low" pulse of the high/low detecting unit 500 is input to the P1, this has no effect on the gate terminal of the pull-up transistor 11, under the low supply voltage.

However, under the high supply voltage more than 6Vt, an output voltage of the first voltage generating unit 300 is constant as 3Vt, whereas the voltage of an n-well increases and therefore, the P2 can fully be turned on. Accordingly, when the external supply voltage is unstable as the high voltage and the output of the sense amplifier goes to the logic "low" state, by temporarily replenishing the gate current of the pull-up transistor 11 to reduce the voltage gradient, it can be prevented for the current through the pull-up transistor 11 to flow rapidly. At this time, the pulse by the low/high detecting unit 600 is not generated.

Next, regarding an operation of the circuit in case that the output of the sense amplifier SA is changed from the logic "low" level to the logic "high" level, if the output of the sense amplifier SA is the logic "low" level, an input of the logic "low" level is provided to the gate terminals of the pull-up transistor 11 and the pull-down transistor 12 and then, the pull-up transistor operates and thereby, the output terminal OUT of the output buffer outputs an output of the logic "high" level. Then, if the output of the sense amplifier SA goes to the logic "high" level by next output data, the logic "high" pulse as the delay time through the inverters INV6, INV7 and NV8 is output by the low/high detecting unit 600 to turn on the NOS transistor N2.

The second voltage generating unit 400 outputs a given voltage (supply voltage −3Vt) and the output value thereof is increased under the high supply voltage, thereby turning on the NMOS transistor N1 of the discharging unit 200. Accordingly, when the input of the sense amplifier SA goes from the logic "low" level to the logic "high" level under the high supply voltage, it can be prevented for the voltage of the gate terminal of the pull-down transistor to increase rapidly by temporarily reducing the current through the N1 and N2.

Figure 3:
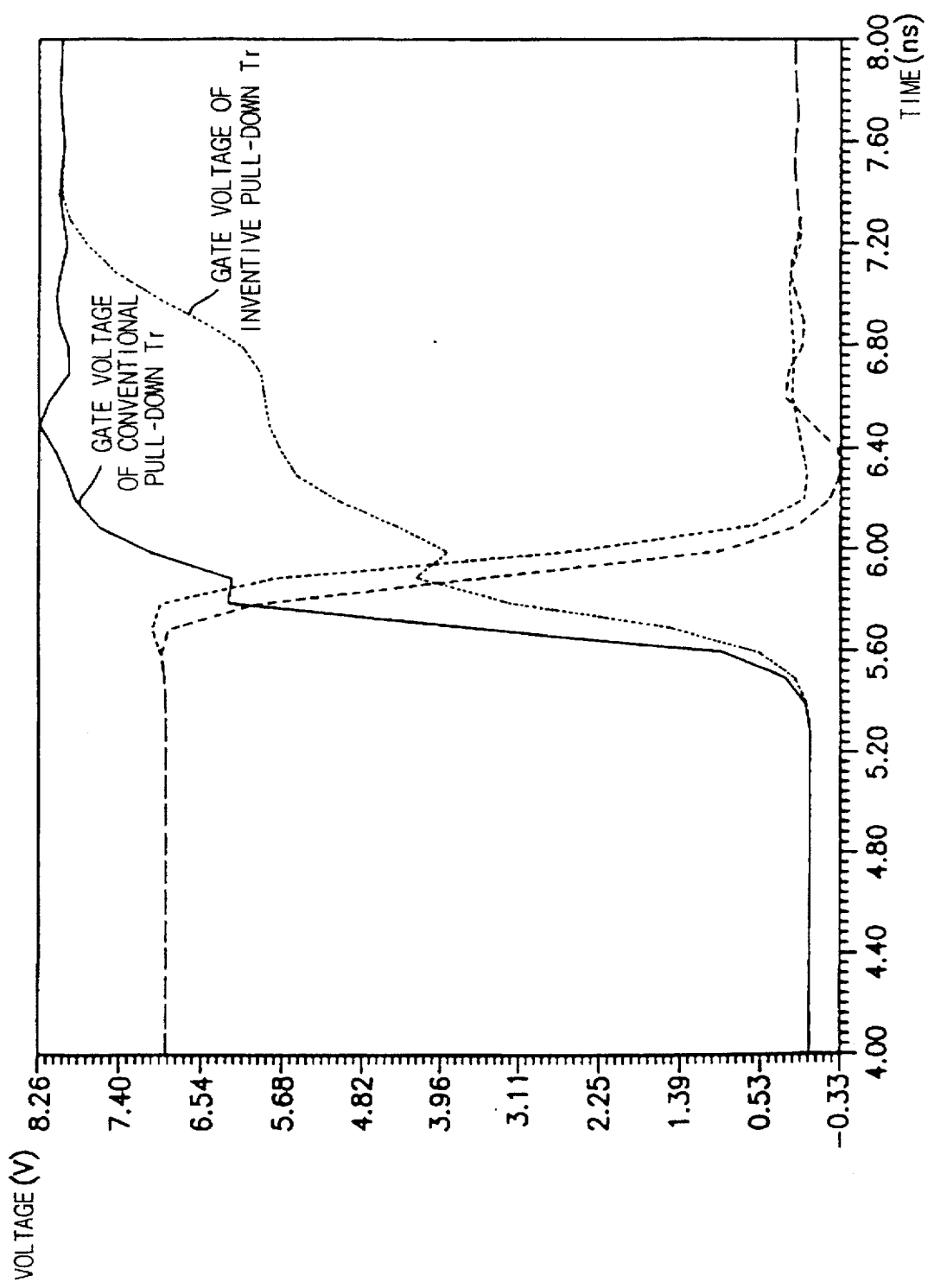
FIG. 3 shows a gate voltage graph of a pull-down transistor in a conventional output buffer and an inventive output buffer.

FIG. 3 shows the gate voltage of the pull-down transistor in the conventional output buffer and the inventive output buffer, and through FIG. 3, it can be found that the gradient of the output voltage reduces in the present invention.

Figure 4:
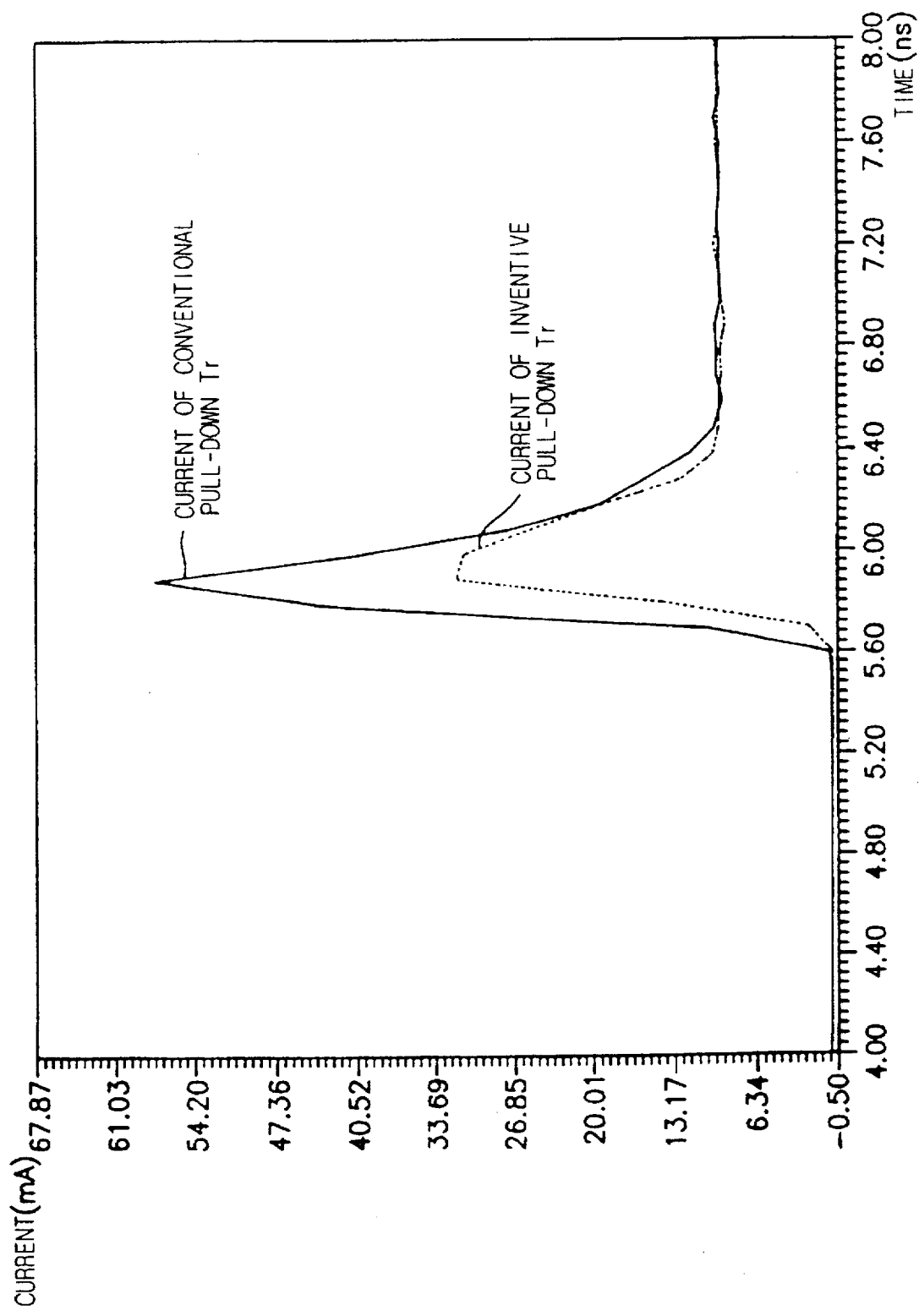
FIG. 4 sows a peak current graph of a pull-down transistor in a conventional output buffer and an inventive output buffer.

Further, FIG. 4 shows the peak voltage of the pull-down transistor in the conventional output buffer and the inventive output buffer, and through FIG. 4, it can be found that the peak current flowing through the N3 reduces by 55% from the 57.7 mA to 31.7 mA due to the reduced voltage gradient of the gate terminal of the pull-down transistor.

In the present invention, the noise can be ignored under the stable low supply voltage and therefore, it is possible to achieve a high-speed operation. Furthermore, the present invention has an effect capable of preventing generation of the noise by reducing the peak current of the pull-up and pull-down transistors under the unstable high supply voltage.

It will be apparent to those skilled in the art that various modifications and variations can be made in a high-speed and low-noise output buffer of the present invention without departing from the spirit or scope of the invention. Thus, it is intended that the present invention cover the modifications and variations of this invention provided they come within the scope of the appended claims and their equivalents.

What is claimed is:

1. An output buffer of a semiconductor memory device having a pull-up transistor inputting an output value from a sense amplifier at its gate terminals to pull up an output terminal and a pull-down transistor pulling down said output terminal, comprising:

first reducing means for reducing a voltage gradient of a pull-up transistor by temporarily charging voltage of the gate terminal of said pull-up transistor when an unstable high voltage is applied from an external supply voltage unit and the output value of said sense amplifier is changed from a logic "high" level" to a logic "low" level;

second reducing means for reducing a voltage gradient of a gate terminal of a pull-down transistor by temporarily discharging voltage of the gate terminal of said pull-down transistor when an unstable high voltage is applied from an external supply voltage unit and the output value of said sense amplifier is changed from a logic "low" level to a logic "high" level;

first voltage generating means connected to said first reducing means to output a given voltage by which said first reducing means is off to said first reducing means when a stable low voltage is applied from the external supply voltage unit; and second voltage generating means connected to said second reducing means to output a given voltage by which said second reducing means is off to said second reducing means when a stable low voltage is applied from the external supply voltage unit.

2. An output buffer as claimed in claim 1, wherein said first reducing means comprises high/low detecting means detecting an output value of said sense amplifier being changed from the logic "high" level to the logic "low" level to generate a given pulse, and a charging means which is comprised of a first and a second PMOS transistors serially connected between said supply voltage unit and gate terminal of said pull-up transistor and inputs the given pulse from said high/low detecting means to temporarily charge the voltage of the pull-up transistor of the output terminal.

3. An output buffer as claimed in claim 1, wherein said second reducing means comprises low/high detecting means detecting an output value of said sense amplifier being changed from the logic "low" level to the logic "high" level to generate a given pulse, and discharging means which is comprised of a first and a second NMOS transistors serially connected between the gate terminal of said pull-down transistor and a ground voltage unit and inputs the given pulse from said low/high detecting means to temporarily discharge the voltage of the pull-down transistor of the output terminal.

4. An output buffer as claimed in claim 2, wherein said first voltage generating means comprises a third PMOS transistor a channel of which is formed between said supply voltage unit and the gate of said second PMOS transistor of said charging means, and an NMOS transistor of a plural diode type serially connected between the gate of said second PMOS transistor of said charging unit and ground voltage unit.

5. An output buffer as claimed in claim 2, wherein said second voltage generating means comprises a third NMOS transistor a channel of which is formed between said ground voltage unit and the gate of said second NMOS transistor of said discharging means, and an NMOS transistor of a plural diode type serially connected between the supply voltage unit and the gate of said second NMOS transistor of said discharging unit.

6. An output buffer as claimed in claim 2, wherein said high/low detecting means comprises a logic circuit generating a logic "low" pulse to the gate terminal of said first PMOS transistor of said charging means when the output value of said sense amplifier is changed from the logic "high" level to the logic "low" level.

7. An output buffer as claimed in claim 3, wherein said low/high detecting means comprises a logic circuit generating a logic "high" pulse to the gate terminal of said first NMOS transistor of said discharging means when the output value of said sense amplifier is changed from the logic "low" level to the logic "high" level.

8. An output buffer as claimed in claim 6, wherein said high/low detecting means is provided with an NAND gate inputting an inverted signal of said sense amplifier at its one input terminal and a delayed signal of said sense amplifier at its other input terminal.

9. An output buffer as claimed in claim 7, wherein said low/high detecting means is provided with an NOR gate inputting an inverted signal of said sense amplifier at its one input terminal and a delayed signal of said sense amplifier at its other input terminal.

* * * * *